(12) United States Patent
Seifried

(10) Patent No.: US 8,208,263 B2
(45) Date of Patent: Jun. 26, 2012

(54) ELECTRONIC DEVICE

(75) Inventor: Kai Seifried, Brühl (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 626 days.

(21) Appl. No.: 11/433,054

(22) Filed: May 12, 2006

(65) Prior Publication Data

US 2007/0019392 A1  Jan. 25, 2007

(30) Foreign Application Priority Data

May 12, 2005  (EP) .................................. 05010296

(51) Int. Cl.
*H05K 7/10*  (2006.01)
(52) U.S. Cl. ..... 361/752; 361/730; 439/76.1; 174/50.52
(58) Field of Classification Search .................. None
See application file for complete search history.

(56) References Cited

U.S. PATENT DOCUMENTS

| | | | | |
|---|---|---|---|---|
| 4,152,750 A | | 5/1979 | Bremenour et al. | 361/383 |
| 4,480,835 A | | 11/1984 | Williams | 273/148 B |
| 5,660,568 A | * | 8/1997 | Moshayedi | 439/654 |
| 6,007,372 A | * | 12/1999 | Wood | 439/502 |
| 6,272,021 B1 | * | 8/2001 | Nagamine et al. | 361/796 |
| 6,283,789 B1 | * | 9/2001 | Tsai | 439/502 |
| 6,417,786 B2 | * | 7/2002 | Learman et al. | 340/988 |
| 6,628,529 B2 | * | 9/2003 | Takamoto et al. | 361/800 |
| 6,775,151 B2 | * | 8/2004 | Suzuki | 361/788 |
| 6,795,770 B1 | * | 9/2004 | Hanshew et al. | 701/213 |
| 6,855,003 B1 | * | 2/2005 | Wyant | 439/502 |
| 7,151,950 B1 | * | 12/2006 | Oyang et al. | 455/556.1 |
| 7,215,279 B1 | * | 5/2007 | Poindexter et al. | 342/357.75 |
| 7,440,845 B1 | * | 10/2008 | Laverick et al. | 701/200 |
| 7,446,715 B2 | * | 11/2008 | Lim | 343/702 |
| 7,468,692 B1 | * | 12/2008 | Wiegers | 342/357.51 |
| 7,546,634 B2 | * | 6/2009 | Wu et al. | 726/9 |
| 2002/0050384 A1 | | 5/2002 | Schopp et al. | 174/70 B |
| 2010/0216341 A1 | * | 8/2010 | Bryant-Rich | 439/607.22 |

FOREIGN PATENT DOCUMENTS

| | | |
|---|---|---|
| EP | 0434192 A2 | 6/1991 |
| EP | 0434192 A3 | 7/1992 |
| EP | 0591657 A1 | 4/1994 |
| EP | 0654960 A1 | 5/1995 |
| EP | 0950570 A2 | 10/1999 |
| EP | 0950570 A3 | 10/2002 |

* cited by examiner

*Primary Examiner* — Dameon Levi
(74) *Attorney, Agent, or Firm* — The Eclipse Group LLP

(57) ABSTRACT

An electronic device includes a housing having an aperture and a main circuit board disposed in housing. The main circuit board includes an edge and a plurality of contact surfaces located at the edge proximate to the aperture, whereby a mating connector is connectable to the contact surfaces by inserting the mating connector into the housing from outside of the housing via the aperture. An update connector adapter includes a support structure and a mating connector mounted on the support structure. The mating connector includes a plurality of contact terminals for contacting the contact surfaces. The update connector adapter further includes an update connector mounted to the support structure. A programming unit is connectable to the update connector for programming the main circuit board. The control unit may be programmed by inserting the update connector adapter into the aperture and connecting the mating connector to the contact surfaces.

22 Claims, 7 Drawing Sheets

ELECTRONIC DEVICE

RELATED APPLICATIONS

This application claims priority of European Patent Application Serial Number 05 010 296.1, filed on May 12, 2006, titled ELECTRONIC DEVICE; which is incorporated by reference in this application in its entirety.

BACKGROUND OF THE INVENTION

1. Field of the Invention

This invention relates to an electronic device, to an update connector adapter for interfacing with the electronic device, and to a system and method for programming a control unit of the electronic device. The electronic device may, for example, be provided in a passenger compartment of a vehicle.

2. Related Art

In the art, electronic devices are known that include a main circuit board and a housing in which the main circuit board is fixedly arranged. Such electronic devices may be incorporated into a dashboard of a vehicle and are often part of a multimedia system incorporated into the vehicle. These multimedia systems often comprise a navigation module for guiding the user to a predetermined destination, an audio module for reproducing audio data such as compact discs (CDs), a radio module, and/or a telecommunication module. These electronic devices normally include one main circuit board having one or two main control units for controlling the functioning of the different modules. During the design or manufacture of these electronic devices and also at a later stage, it is often necessary to transmit new software or other data or signals to the electronic device.

FIG. 1 is a perspective view of a prior art electronic device. The electronic device of the prior art includes a main circuit board 100 on which a first control unit 110 and a second control unit 120 are mounted. These microprocessors 110 and 120 control the functioning of the different operating modes of the electronic device. During the design of the electronic device or also later on, it may be necessary to reconfigure the system or to upload new software or data for controlling the electronic device. To this end, two update connectors 130 and 140 are provided on the main board 100 for connecting a debug interface or any other programming unit providing new data or instructions for the two electronic control units 110 and 120. If the electronic device including the main circuit board 100 is incorporated into the dashboard of a vehicle or into another type of assembled support structure, this means that the electronic built-in device must be removed from the dashboard, and the housing (not shown) around the main circuit board must be opened to access the two update connectors 130 and 140. This makes updating the electronic device complicated, time-consuming, laborious, and costly.

Therefore, there is a need for providing easier access to a main circuit board of an electronic device.

SUMMARY

According to one implementation, an electronic device includes a housing having an aperture and a main circuit board disposed in housing. The main circuit board includes an edge and a plurality of contact surfaces located at the edge proximate to the aperture, whereby a mating connector is connectable to the contact surfaces by inserting the mating connector into the housing from outside of the housing via the aperture According to another implementation, an update connector adapter includes a support structure and an edge connector mounted on the support structure. The edge connector includes a plurality of contact terminals for contacting contact surfaces provided at the edge of a main circuit board. The update connector adapter further includes an update connector to which a programming unit is connectable for programming the main circuit board, the update connector mounted to the support structure.

According to another implementation, a control unit programming system is provided. The system may include an electronic device and an update connector adapter as summarized above. The edge connector of the update connector adapter is connected to the contact surfaces located at the edge of the main circuit board of the electronic device.

According to another implementation, a method for programming a control unit of an electronic device is provided. An update connector adapter is inserted into an aperture of a housing of the electronic device. An edge connector provided on the update connector adapter is connected to contact surfaces facing the aperture. The contact surfaces are provided on a main circuit board disposed in the housing of the electronic device. Programming data are transmitted to the control unit via the update connector adapter.

According to another implementation of the method, a programming unit is connected to the update connector adapter to transmit the programming data to the control unit via the update connector adapter.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
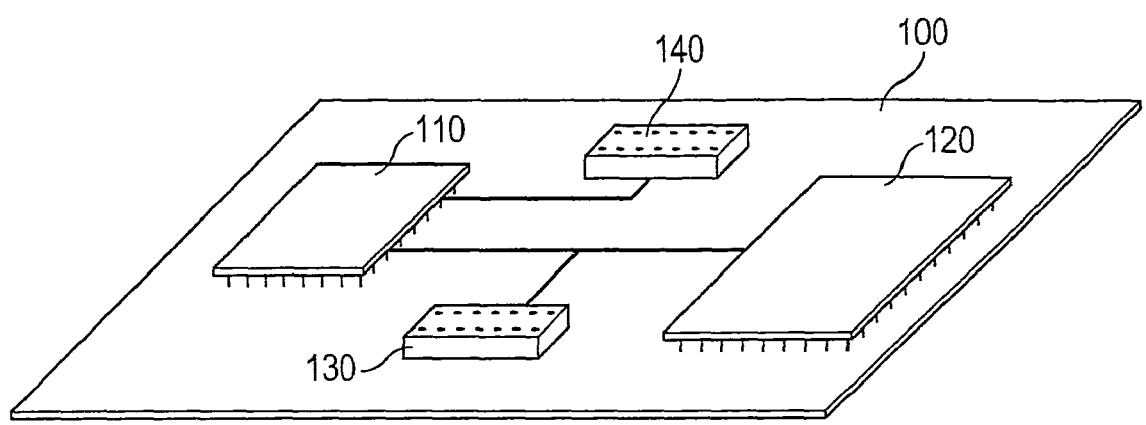
FIG. 1 is a perspective view of a main circuit board of an electronic device of the prior art.

As noted above, FIG. 1 illustrates a main circuit board 100 of an electronic device (not shown) of the prior art. In FIG. 1, the update connectors 130 and 140 are provided on the main circuit board 100 for updating the control units 110 and 120.

Figure 2:
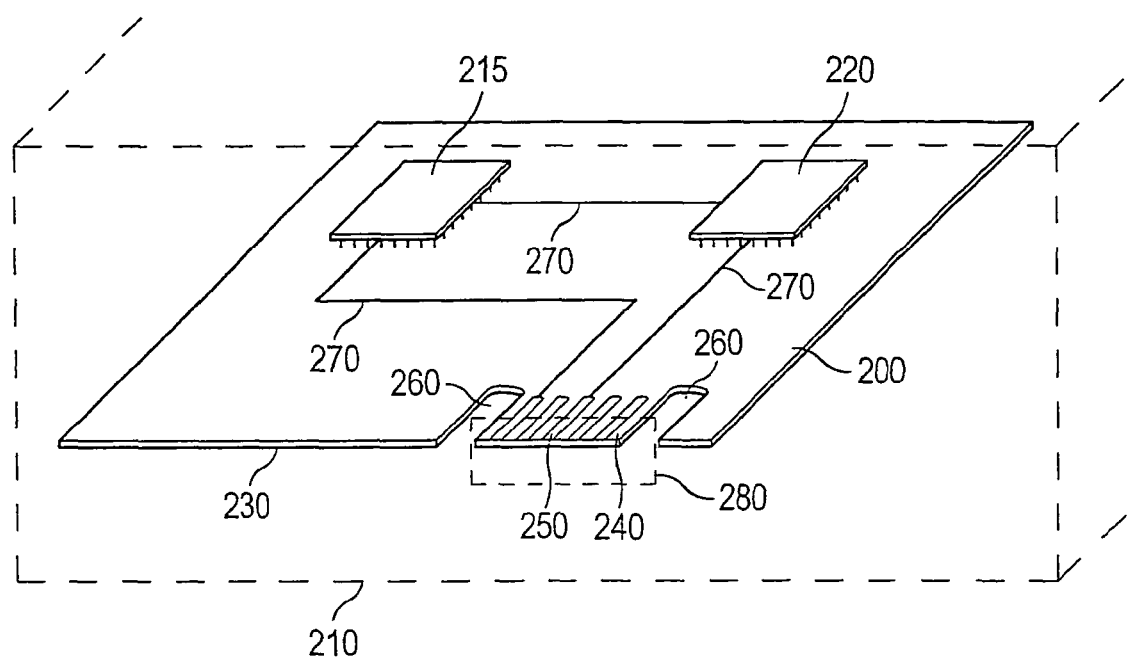
FIG. 2 is a perspective view of an example of a main circuit board of an electronic device according to the invention.

FIG. 2 is a perspective view of an example of a main circuit board 200 of an electronic device according to the invention. The electronic device comprises a housing 210, which is shown in phantom lines. The electronic device may be incorporated into a vehicle or may be incorporated into any other support structure supporting the housing 210 of the electronic device. The main circuit board 200 includes a first control unit 215 connected to the main board 200 and a second control unit 220 connected to the main board 200. It will be understood that the main board 200 may include more or less control units as well as many other electronic components, which are omitted for the sake of clarity.

The main circuit board 200 includes at one of its edges 230 a cantilevered portion or blade 240 on which contact surfaces 250 are provided. At its front end, the blade 240 is separated from the rest of the main circuit board 200 by two cut-out sections 260 that receive a mating connector, as will be explained in detail below. On the main circuit board 200, circuit board tracks or interconnects 270 are provided which connect the contact surfaces 250 to the control units 215 and 220.

In some implementations, the contact surfaces 250 located at the edge 230 of the main circuit board 200 are located directly on a main surface of the main circuit board 200 as shown in FIG. 2. By providing the contact surfaces 250 directly on the main surface, a support structure such as a connector housing need not to be provided on the main circuit board 200. In other implementations, the contact surfaces 250 are provided on both sides of the main circuit board 200, i.e. on both the upper and lower sides of the main circuit board 200. This latter implementation may assist in providing as many contact surfaces 250 as possible on a predetermined small amount of space of the main circuit board 200. These contact surfaces 250 may be used for accessing any modules provided on the main circuit board 200. The main circuit board 200 may be designed such that conductive tracks leading from the contact surfaces 250, such as tracks 270, connect all the important components of the main circuit board 200 to the contact surfaces 250, so that these components can be accessed through the contact surfaces 250.

Figure 4:
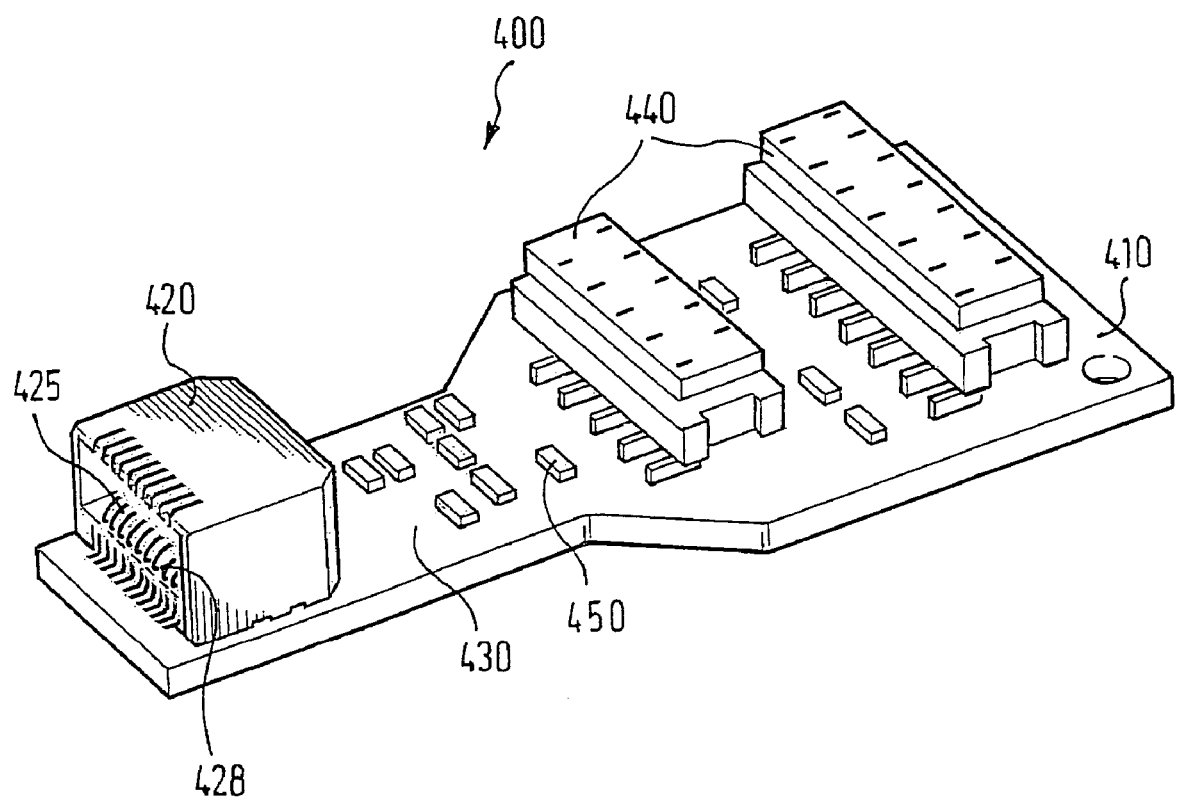
FIG. 4 is a perspective view of an update connector adapter according to the invention.

In the housing 210 of the electronic device, a recess, cut-out section or aperture 280 is provided at a location facing the contact surfaces 250, so that a mating connector (as shown in FIG. 4) may be introduced into the housing 210 for contacting the contact surfaces 250. It may be seen from FIG. 2 that the arrangement of the contact surfaces 250 located at the edge 230 of the main circuit board 200 relative to the aperture 280 helps to facilitate access to the main circuit board 200. The contact surfaces 250 are arranged next to the aperture 280, so that the contact surfaces 250 are accessible by the mating connector, which as described further below may be inserted into the housing 210 from the outside of the housing 210. The contact surfaces 250 are provided on the main circuit board 200 and are connected to the control units 215 and 220 in such a way that programming data such as new software for the control units 215 and 220 can be uploaded. Additionally, a debugging unit may be connected to the two control units 215 and 220 via the contact surfaces 250 to find a protocol of a faulty operation of the electronic device.

In comparing FIG. 1 to FIG. 2, the electronic device of the invention is configured such that the two update connectors 130 and 140 need not to be provided on the main circuit board 200, as in the case of prior art embodiments as illustrated in FIG. 1, thus leaving more free space for other electronic components and contributing to a cost-effective manufacturing of the electronic device, as the two connectors may be omitted from the main circuit board 200. Moreover, the main circuit board 200 and its associated electronic device are accessible from the outside by a mating connector so that the housing 210 does not need to be opened or disassembled, and the electronic device does not need to be removed from its associated support structure (e.g., a dashboard), when it is desired to access the main circuit board 200 or to access any electronic device provided on the main circuit board 200. Additionally, the space needed for the connectors provided on the main circuit board need not to be provided either.

Figure 3:
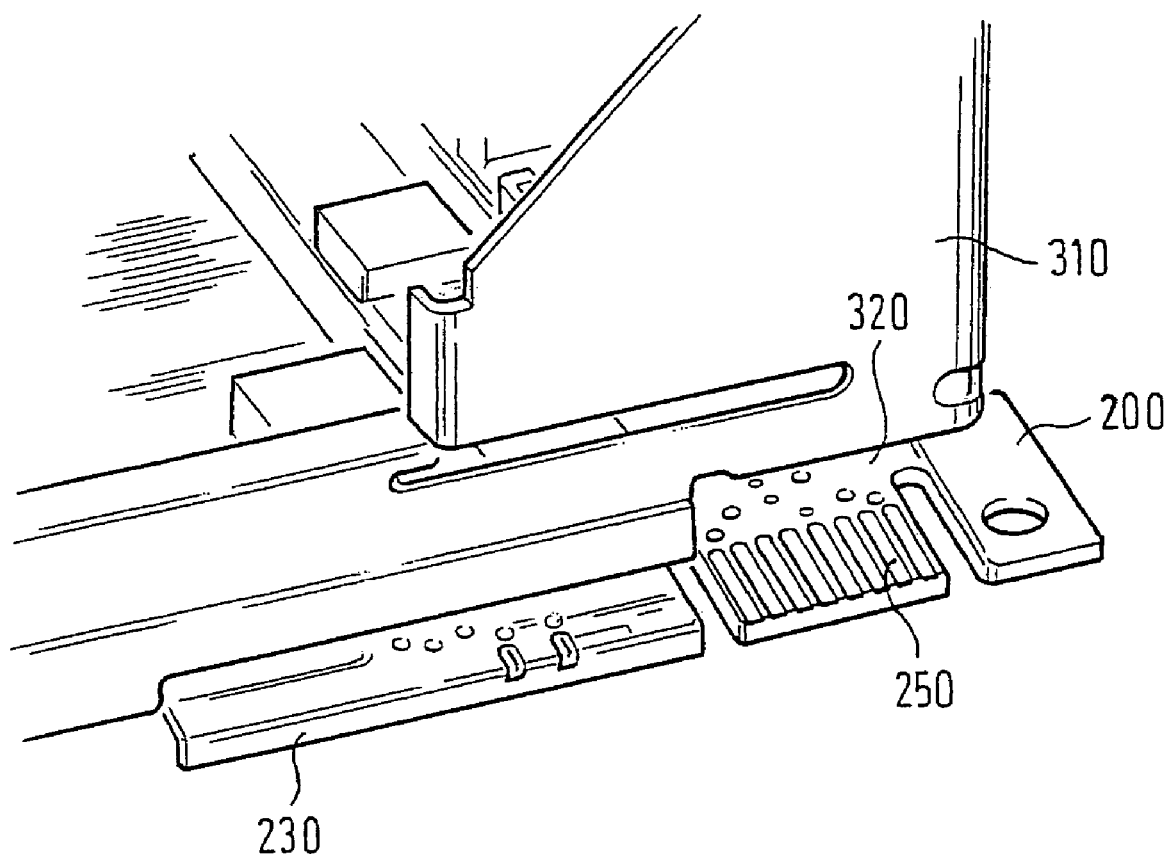
FIG. 3 is a perspective view showing a part of the main circuit board illustrated in FIG. 2 and contact surfaces provided at an edge of the main circuit board.

FIG. 3 is a perspective view showing part of the main circuit board 200, the housing 210 (FIG. 2) of the electronic device being omitted for the sake of clarity. In the example illustrated in FIG. 3, the main circuit board 200 is shown together with a frame 310 that is provided in the electronic device. The frame 310 may be employed to support the different electronic modules provided with the electronic device relative to each other. The electronic device may be a head unit of a vehicle, comprising different electronic modules such as a navigation module, an audio module, a telecommunication module and/or a radio module. Some or all of these modules may be controlled by the main circuit board 200. The frame 310 has a cutout section 320 located above the contact surfaces 250 to facilitate the inserting of a mating connector. A1

FIG. 4 is a perspective view showing an example of an update connector adapter 400 of the invention. The adapter 400 includes a support board 410 on which an edge connector or mating connector 420 is provided on a latch 430 of the support board 410. The latch 430 may be designed (e.g., sized and shaped) in such a way that it fits into the aperture 280 of the housing 210 of the electronic device. By inserting the latch 430 into the aperture 280, the edge connector 420 contacts the contact surfaces 250 of the main circuit board 200.

The edge connector 420 includes a connector socket having a large opening 425 for receiving the cantilevered part 240 of the main circuit board 200 (FIG. 2). Additionally, contact terminals 428 are provided in the edge connector 420 for contacting the contact surfaces 250. The contact terminals 428 may be provided on the upper and the lower part of the housing of the edge connector 420, so that contact surfaces 250 provided on both surfaces of the main circuit board 200 can be contacted. Other aspects of the edge connector 420 are known to persons skilled in the art, so that a further detailed description of the edge connector 420 is not necessary. A2

Additionally, two update connectors 440 are provided on the support board 410. These update connectors 440 may correspond to or be similar to the update connectors 130 and 140 provided directly on the main circuit board 100 of the prior art (FIG. 1). However, any other update connectors may be used. These update connectors 440 may be used for connecting a programming unit such as a user debug interface or any device for uploading data to the control units 215 and 220 (FIG. 2). Connectors such as the two update connectors 440 are known in the art, so that a detailed description of the update connectors 440 is not needed. Additionally, on the support board 410, resistors 450 may be provided for adapting the voltage from a programming unit to the voltage supplied to the control units 215 and 220 on the main circuit board 200. In the update connector adaptor 400, tracks or interconnects (not shown) are provided for connecting the contact terminals of the two update connectors 440 to the contact terminals 428 of the edge connector 420. As can be seen in FIG. 4, the two update connectors 440 need only be provided on the update connector adapter 400, and do not need to be provided on the main circuit board 200 (FIG. 2) itself.

Figure 5:
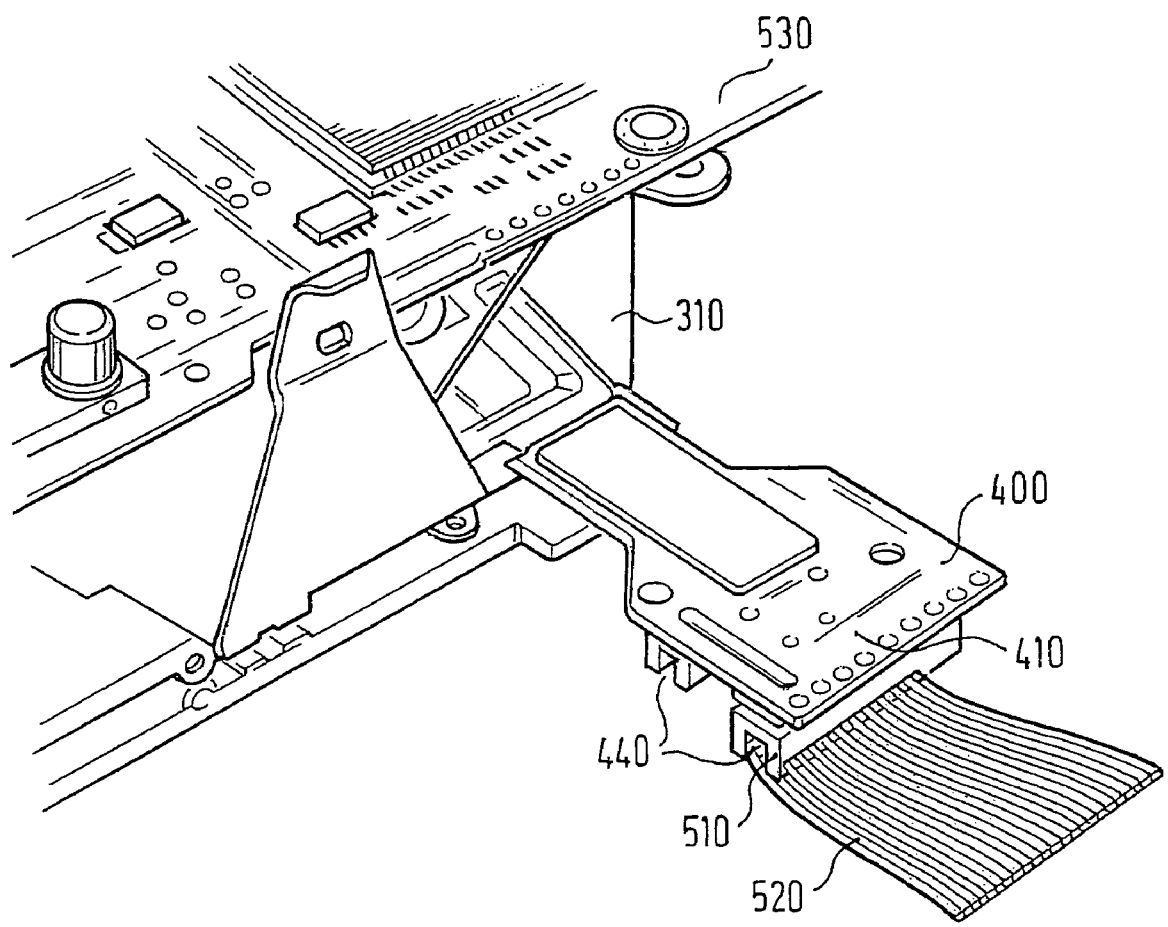
FIG. 5 is a perspective view of the update connector adapter illustrated in FIG. 4 connected to the main circuit board illustrated in FIG. 3.

FIG. 5 is a perspective view of the update connector adapter 400 in its connected state, In which the update connector adapter 400 is connected to the contact surfaces 250 of the main circuit board 200 (FIG. 2). In the illustrated example, the update connector adapter 400 is in a position with the support board 410 on the upper side, the two update connectors 440 being on the lower side. Additionally, a complementary connector 510 is shown connected to one of the update connectors 440. The edge connector 420 is slid onto the cantilevered part 240 (FIG. 2) of the main circuit board 200, such that the contact elements 428 of the edge connector 420 (FIG. 4) contact the contact surfaces 250 provided either on one of the surfaces or on both of the surfaces of the main circuit board 200. In the connected state shown in FIG. 5, programming data can be transmitted from a programming unit (not shown) via a ribbon cable 520 or any other suitable interface through one of the update connectors 440, through the edge connector 420 and the contact surfaces 250, and to the control units 215 and 220.

In the embodiment shown in FIG. 5, a tuner circuit board 530 is connected to the frame 310 as an example indicating that the electronic device may comprise different electronic modules.

Figure 6:
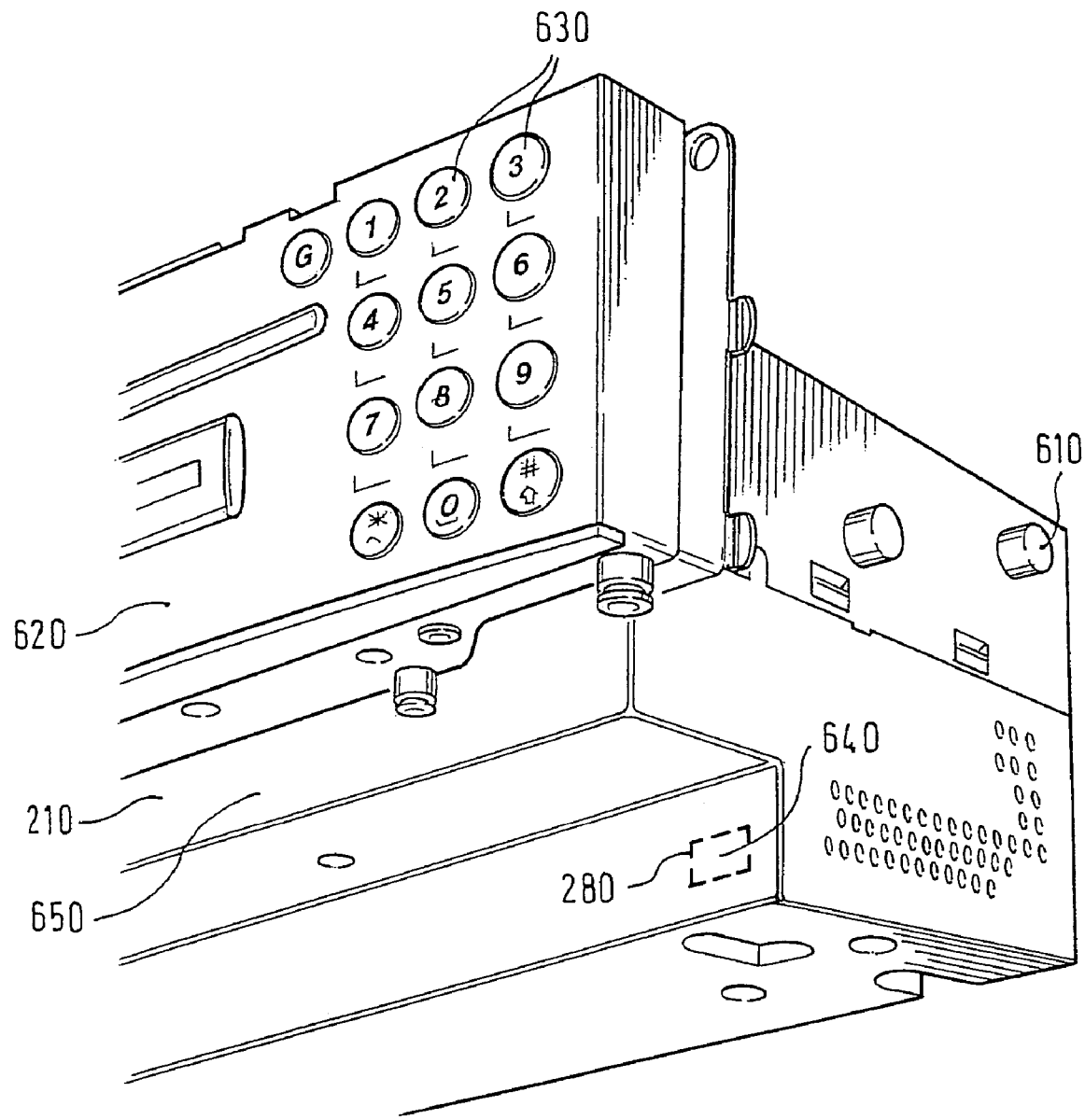
FIG. 6 is a perspective view of an electronic device of the invention having an aperture for enabling connection of the update connector adapter to the main circuit board.

FIG. 6 is a perspective view of an example of the housing 210 of the electronic device. The electronic device may be incorporated into a support structure such as a dashboard of a vehicle utilizing, for example, mounting pegs 610 that are arranged at the side surfaces of the housing 210. On the front part of the housing 210, an operating module 620 may be provided comprising different operating buttons 630 and/or other user-input devices that may be used for the different operating modes of the electronic device. A front surface 650 of the housing 210 may generally face the passenger compartment of the vehicle when the housing 210 is incorporated into a suitable support structure such as, for example, a dashboard, console, head unit, head liner, or the like. The aperture 280 may also be provided on the front surface 650 of the housing 210, allowing easy access of the update connector adapter 400 (FIGS. 4 and 5) to the main circuit board 200 (FIG. 2), even in the mounted state of the housing 210. By providing the aperture 280 on the same surface as the operating module 620, it can be assured that the aperture 280 may be accessed in all cases, as the operating module 620 is normally always accessible to the user of the electronic device. If the operating module 620 is accessible, the aperture 280 is also accessible, so that through the aperture 280 the mating connector 420 (FIG. 4) can contact the contact surfaces 250 located at the edge 230 of the main circuit board 200 (FIG. 2). The rest of the surfaces of the housing 210 could be hidden by the support structure in which the housing 210 may be arranged.

In the mounted state of the housing 210, the control units 215 and 220 (FIG. 2) of the electronic device can be configured or updated in an easy, cost-effective way. For example, a programming unit may be connected to at least one of the connectors 440 of the update connector adapter 400 (FIGS. 4 and 5), the update connector adapter 400 may be inserted into the aperture 280 of the housing 210, and the edge connector 420 provided on the update connector adapter 400 can be connected to the contact surfaces 250 provided on the main circuit board 200. As new data may be transmitted to the control unit or units 215 and 220 without the need for removing the electronic device from a support structure such as a dashboard, the electronic device can be updated in the mounted state. Furthermore, as noted previously, the housing 210 does not need to be opened to access the control units 215 and 220. Additionally, update connectors 440 do not need to be provided on the main circuit board 200 itself.

In the example illustrated in FIG. 6, the aperture 280 is shown covered by a plate 640. When the aperture 280 is not being utilized, the aperture 280 may be covered for shielding the electronic device. If programming data need to be transmitted to one or both control units 215 and 220 of the main circuit board 200, the plate 640 may be removed or bent in such a way that the edge connector 420 may be inserted through the aperture 280. When the update connector adapter 400 is removed, the plate 640 may again be employed to cover the aperture 280. It is also possible to use an adhesive tape having shielding properties to protect the aperture 280 when the aperture 280 is not in use.

The main circuit board 200 (FIG. 2) and its aperture 280 may be located relative to each other in such a way that the housing 210 of the electronic device is a polarizing element preventing the wrong connection of the mating connector 420 (FIG. 4) to the contact surfaces 250 of the main circuit board 200. In such an implementation, the contact surfaces 250 are arranged relative to the housing 210 in such a way that the mating connector 420 coming from the outside can only be connected to the main circuit board 200 in one orientation. The connecting of the mating connector 420 in other orientations is prevented and blocked by the housing 210.

Figure 7:
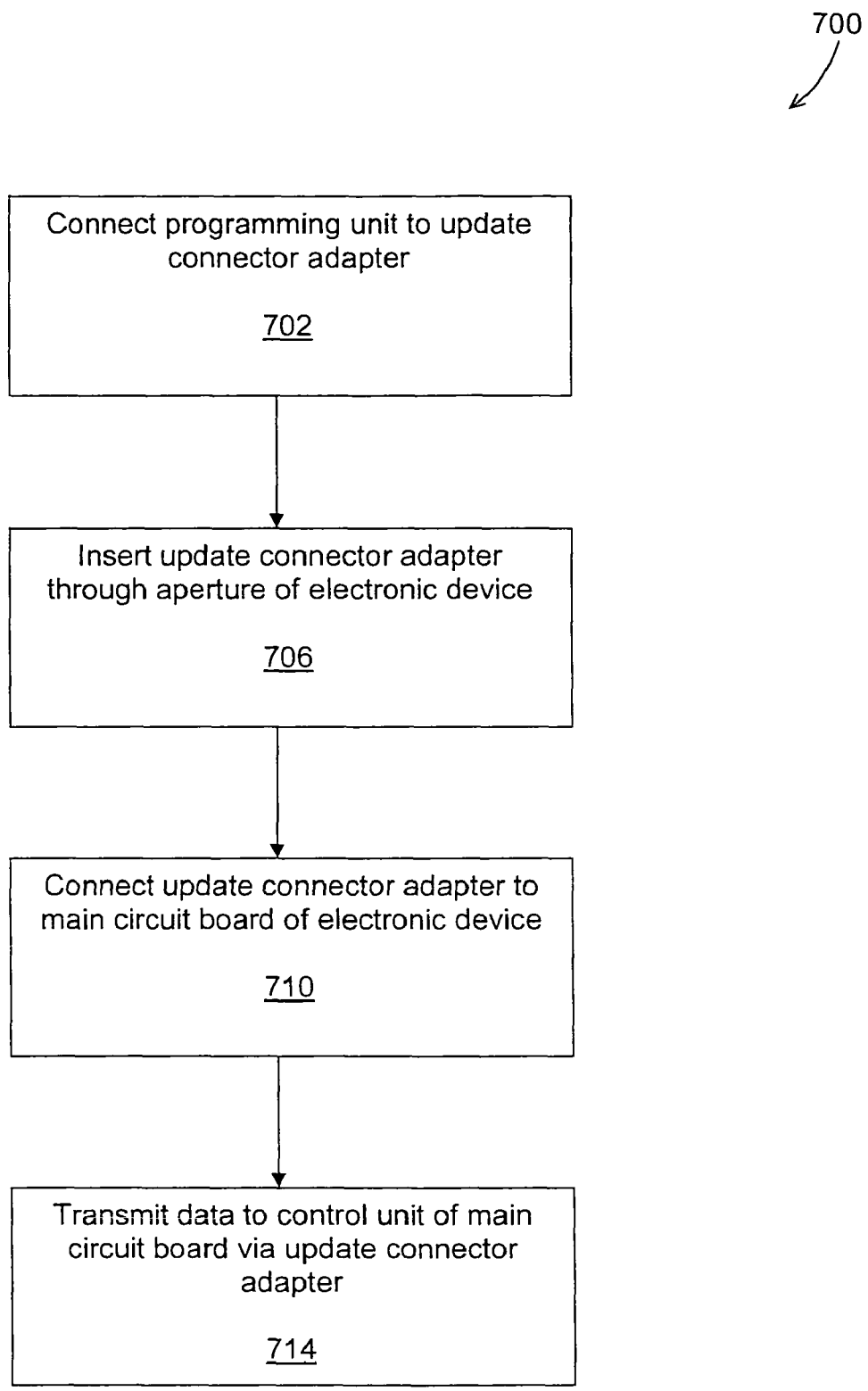
FIG. 7 is a flow diagram illustrating an example of a method for programming a control device according to the invention.

FIG. 7 is a flow diagram 700 illustrating an example of a method for programming a control device according to the invention. According to this example, at block 702, a programming unit is connected to the update connector adapter 400 (FIG. 4), such as through a direct connection with one of the update connectors 440 or by employing a complementary connector 510 and ribbon cable 520 or other suitable interface (FIG. 5). At block 706, the update connector adapter 400 is inserted into the aperture 280 of the housing 210 of the electronic device. At block 710, the edge connector 420 (FIG. 4) of the update connector adapter 400 is connected to one or more contact surfaces 250 (FIGS. 2 and 3) of the main circuit board 200 (FIG. 2) disposed in the housing 210 of the electronic device. At block 714, data are transmitted from the programming unit to one or more control units 215 and 220 (FIG. 2) of the main circuit board 200 via the update connector adapter 400. As previously noted, these data may, for example, include a software update or any other information or signals needed for the functioning of the control unit or units 215 and 220.

FIG. 7 may also represent an example of an apparatus or system 700 for implementing the method for programming a control device according to the invention. In this implementation, block 702 may be considered as depicting a programming unit that is connected to the update connector adapter 400.

In conclusion, the invention provides a solution for programming a control unit provided in an electronic device in an easy way. Even if the electronic device does not work at all, by way of example, if no software at all is provided in the electronic device for running the latter, this software may be transmitted to contact surfaces of the electronic device through an aperture provided in a housing of the electronic device. Additionally, the main circuit board of the electronic device need not to provide space for accommodating update connectors, as the update connectors are moved to the outside and may be provided on an update connector adapter configured to interface with the main circuit board via the aperture of the housing of the electronic device.

The foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. An electronic device that functions according to one or more operating modes comprising:
   a housing configured to permit the electronic device to be mounted in a support structure in a vehicle passenger compartment;
   a main circuit board disposed in the housing, the main circuit board including a cantilevered portion at an edge of the main circuit board and a plurality of contact surfaces located at the cantilevered portion at the edge of the main circuit board;
   an aperture in the housing, the aperture being positioned to permit access to the main circuit board from the vehicle passenger compartment when the electronic device is mounted therein; and
   wherein programming data received via the contact surfaces updates functionality of at least one of the operating modes.

2. The electronic device of claim 1, where the main circuit board includes at least one control unit for controlling at least one of the operating modes of the electronic device, the control unit including at least one contact area through which the control unit is programmed, where the at least one contact area is one of the contact surfaces, whereby the control unit is programmable by connecting a mating connector to the contact surfaces and transmitting the programming data to the control unit from outside of the housing via the mating connector.

3. The electronic device of claim 1, where the housing includes a front surface, and the aperture is formed through the front surface.

4. The electronic device of claim 1, where the main circuit board and the aperture are located relative to each other in a manner enabling the mating connector to be connected to the contact surfaces in a single orientation.

5. The electronic device of claim 1, where the main circuit board includes a main surface and the contact surfaces are located directly on the main surface.

6. The electronic device of claim 1, where the contact surfaces are located directly on opposite surfaces of the main circuit board.

7. The electronic device of claim 1, where the main circuit board includes at least one control unit for controlling at least one of the operating modes of the electronic device, the control unit including at least one contact area through which the control unit can be programmed, where the at least one contact area is one of the contact surfaces, whereby the control unit is programmable by connecting a mating connector to the contact surfaces and transmitting the programming data to the control unit from outside of the housing via the mating connector, and where the housing includes a front surface and the electronic device further includes an operating module for operating the electronic device, and the aperture is formed through the front surface.

8. The electronic device of claim 1, where the electronic device is a built-in electronic device for a vehicle mountable in a passenger compartment of the vehicle, and the aperture of the housing faces the passenger compartment, and where the housing includes a removable plate for covering the aperture.

9. An update connector adapter for updating a main circuit board in an electronic device mounted in a vehicle passenger compartment that functions according to one more operating modes, comprising:
   a support board;
   an edge connector mounted on the support board to which a cantilevered portion at an edge of the main circuit board is engageable from the vehicle passenger compartment via an aperture in a housing on the electronic device, the edge connector including a plurality of contact terminals for contacting contact surfaces provided at the cantilevered portion at the edge of the main circuit board;
   an update connector to which a programming unit is connectable for programming the main circuit board, the update connector mounted to the support board; and
   wherein programming data uploaded to the main circuit board via the contact terminals updates functionality of at least one of the operating modes.

10. The update connector, adapter of claim 9, further comprising an additional update connector mounted to the support board.

11. The update connector adapter of claim 9, where the support board includes a latch and the edge connector is mounted on the latch, and the latch is insertable through an aperture of a housing in which the main circuit board is disposed, whereby the edge connector is connectable to the contact surface of the main circuit board.

12. A control unit programming system, comprising:
   an electronic device that functions according to one or more operating modes, the electronic device including a housing and a main circuit board disposed in the housing, the housing permits the electronic device to be mounted in a support structure in a vehicle passenger compartment, the main circuit board including a cantilevered portion at an edge of the main circuit board and a plurality of contact surfaces located at the cantilevered portion at the edge of the main circuit board, an aperture in the housing, the aperture being positioned to permit access to the main circuit board from the vehicle passenger compartment when the electronic device is mounted therein;
   an update connector adapter including a support board and an edge connector mounted on the support board, the update connector adapter is engageable to the cantilevered portion at the edge of the main circuit board from the vehicle passenger compartment via the aperture in the housing on the electronic device, the edge connector including a plurality of contact terminals for contacting the contact surfaces, where the edge connector is connected to the contact surfaces at the cantilevered portion at the edge of the main circuit board, the update connector adapter further including an update connector to which a programming unit is connectable for programming the main circuit board, the update connector mounted to the support board; and
   wherein programming data unloaded from the update connector adapter to the electronic device updates functionality of at least one of the operating modes.

13. The system of claim 12, further comprising a programming unit connected to the update connector adapter for programming the control unit on the main circuit board.

14. The system of claim 12, where the main circuit board includes at least one control unit for controlling at least one of the operating modes of the electronic device, the control unit including at least one contact area through which the control unit can be programmed, where the at least one contact area is one of the contact surfaces, whereby the control unit is programmable by connecting the mating connector to the contact surfaces and transmitting the programming data to the control unit from outside of the housing via the mating connector.

15. The system of claim 12, where the housing includes a front surface, and the electronic device further comprises an operating module for operating the electronic device, and the aperture is formed through the front surface.

16. The system of claim 12, where the main circuit board includes at least one control unit for controlling at least one of the operating modes of the electronic device, the control unit including at least one contact area through which the control unit can be programmed, where the at least one contact area is one of the contact surfaces, whereby the control unit is programmable by connecting the mating connector to the contact surfaces and transmitting the programming data to the control unit from outside of the housing via the mating connector, and where the housing includes a front surface and the electronic device further includes an operating module for operating the electronic device, and the aperture is formed through the front surface.

17. The system of claim 16, where the support board includes a latch and the edge connector is mounted on the latch, and the latch is insertable through an aperture of the housing in which the main circuit board is disposed, whereby the edge connector is connectable to the contact surface of the main circuit board.

18. The system of claim 12, where the support board includes a latch and the edge connector is mounted on the latch, and the latch is insertable through an aperture of the housing in which the main circuit board is disposed, whereby the edge connector is connectable to the contact surfaces of the main circuit board.

19. The system of claim 12, where the electronic device is a built-in electronic device for a vehicle mountable in a passenger compartment of the vehicle, and the aperture of the housing faces the passenger compartment.

20. A method for programming a control unit of an electronic device from within a vehicle passenger compartment wherein the electronic device functions according to one or more operation modes, the method comprising the steps of:
   inserting an update connector adapter into an aperture of a housing of the electronic device while the electronic device is mounted in a support structure in the vehicle passenger compartment;
   connecting an edge connector provided on the update connector adapter to contact surfaces provided on a cantilevered portion at an edge of a main circuit board disposed in the housing of the electronic device, the contact surfaces facing the aperture;
   transmitting programming data to the control unit via the update connector adapter; and
   updating functionality of at least one of the operating modes based on the programming data received at the control unit.

21. The method of claim 20, further comprising connecting a programming unit to the update connector adapter to transmit the programming data to the control unit via the update connector adapter.

22. The method of claim 20, where the electronic device is provided in a passenger compartment of a vehicle, and the aperture of the housing faces the passenger compartment.

* * * * *

UNITED STATES PATENT AND TRADEMARK OFFICE
CERTIFICATE OF CORRECTION

| | | |
|---|---|---|
| PATENT NO. | : 8,208,263 B2 | |
| APPLICATION NO. | : 11/433054 | |
| DATED | : June 26, 2012 | |
| INVENTOR(S) | : Seifried | |

It is certified that error appears in the above-identified patent and that said Letters Patent is hereby corrected as shown below:

At column 1, line 6, "...filed on May 12, 2006..." should be changed to -- filed on May 12, 2005 --

At column 4, line 1, "...the two connectors may..." should be changed to -- the two connectors 130 and 140 --

Signed and Sealed this
Twenty-ninth Day of January, 2013

David J. Kappos
*Director of the United States Patent and Trademark Office*